(12) United States Patent
Tanaka

(10) Patent No.: US 9,874,813 B2
(45) Date of Patent: Jan. 23, 2018

(54) PHOTOSENSITIVE RESIN MATERIAL AND RESIN FILM

(71) Applicant: SUMITOMO BAKELITE CO., LTD., Tokyo (JP)

(72) Inventor: Yuma Tanaka, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 0 days.

(21) Appl. No.: 14/698,904

(22) Filed: Apr. 29, 2015

(65) Prior Publication Data
US 2015/0316845 A1 Nov. 5, 2015

(30) Foreign Application Priority Data

Apr. 30, 2014 (JP) ................................. 2014-093454

(51) Int. Cl.
| | | |
|---|---|---|
| G03F 7/023 | (2006.01) | |
| G03F 7/004 | (2006.01) | |
| G03F 7/038 | (2006.01) | |
| G03F 7/022 | (2006.01) | |
| H05K 3/28 | (2006.01) | |

(52) U.S. Cl.
CPC .......... *G03F 7/0236* (2013.01); *G03F 7/0045* (2013.01); *G03F 7/0047* (2013.01); *G03F 7/0226* (2013.01); *G03F 7/0233* (2013.01); *G03F 7/038* (2013.01); *H05K 3/287* (2013.01); *H05K 2201/0989* (2013.01)

(58) Field of Classification Search
CPC .................................................. G03F 7/0236
USPC ................. 430/165, 191, 192, 193
See application file for complete search history.

(56) References Cited

U.S. PATENT DOCUMENTS

| | | | | |
|---|---|---|---|---|
| 5,300,628 A | * | 4/1994 | Honda | G03F 7/0048 210/638 |
| 5,350,714 A | | 9/1994 | Trefonas, III et al. | |
| 5,378,802 A | * | 1/1995 | Honda | C08G 8/12 210/638 |
| 5,446,125 A | * | 8/1995 | Honda | C08F 6/06 430/190 |
| 5,446,126 A | | 8/1995 | Honda | |
| 5,614,352 A | * | 3/1997 | Rahman | C08G 8/00 210/660 |
| 5,618,655 A | * | 4/1997 | Davidson | C08G 8/08 430/169 |
| 2003/0087179 A1 | * | 5/2003 | Iwasaki | G03F 7/0233 430/166 |
| 2004/0206702 A1 | * | 10/2004 | Davidson | B01D 11/0492 210/634 |
| 2006/0172231 A1 | * | 8/2006 | Davidson | B01D 11/0492 430/398 |
| 2009/0291393 A1 | * | 11/2009 | Misumi | G03F 7/0233 430/286.1 |
| 2011/0123927 A1 | | 5/2011 | Park et al. | |
| 2013/0022913 A1 | * | 1/2013 | Tanaka | G03F 7/0048 430/270.1 |

FOREIGN PATENT DOCUMENTS

| | | |
|---|---|---|
| CN | 1221497 A | 6/1999 |
| JP | 7-232089 A | 9/1995 |
| JP | 2771076 B2 | 4/1998 |
| JP | 2000-199958 A | 7/2000 |
| JP | 2000-512394 A | 9/2000 |
| JP | 2001-506375 A | 5/2001 |
| JP | 2008-180992 A | 8/2008 |
| JP | 2010-6864 A | 1/2010 |
| JP | 2011/53670 A | 3/2011 |
| JP | 2014-88460 A | 5/2014 |
| JP | 5488752 B1 | 5/2014 |
| JP | 2015-49508 A | 3/2015 |
| KR | 10-2009-0121685 A | 11/2009 |
| WO | WO 97/46915 A1 | 12/1997 |
| WO | WO 98/27461 A1 | 6/1998 |

OTHER PUBLICATIONS

Office Action dated Aug. 10, 2015, in Korean Patent Application No. 10-2015-0056252.
"Encyclopaedia Chimica 7", pp. 731-733, (Kyoritsu Shuppan Co., Ltd., Oct. 30, 1961, First edition, First impression).
Office Action dated Feb. 3, 2016, in Chinese patent Application No. 201510218992.X.

\* cited by examiner

*Primary Examiner* — John S Chu
(74) *Attorney, Agent, or Firm* — Birch, Stewart, Kolasch & Birch, LLP

(57) ABSTRACT

A photosensitive resin material of the invention is a photosensitive resin material used to form a permanent film including one or more selected from a novolac-type phenol resin, a phenol aralkyl resin, and a hydroxystyrene resin as an alkali-soluble resin (A) and a photosensitive diazoquinone compound as a photosensitizing agent (B), in which a content of iron with respect to all non-volatile components, which is measured through flameless atomic absorption spectroscopy, is equal to or more than 0.005 ppm and equal to or less than 80 ppm, and non-ionic iron is included as the iron.

16 Claims, 1 Drawing Sheet

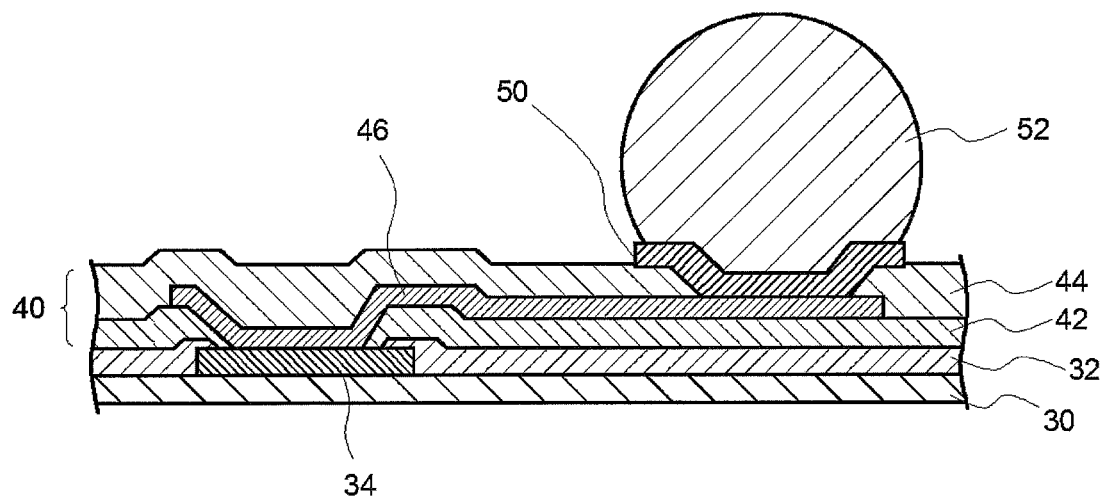

PHOTOSENSITIVE RESIN MATERIAL AND RESIN FILM

This application is based on Japanese Patent Application No. 2014-093454 filed on Apr. 30, 2014, the content of which is incorporated hereinto by reference.

BACKGROUND

Technical Field

The invention relates to a photosensitive resin material and a resin film, and specifically to a photosensitive resin material used to form a permanent film.

Related Art

As a material forming a permanent film that constitutes an electronic device such as an insulating layer that constitutes a re-interconnection layer, there are cases in which a photosensitive resin material is used. For example, Japanese Laid-Open Patent Publication No. 2008-180992 and Japanese Laid-Open Patent Publication No. 2010-006864 describe the above-described techniques.

The technique described in Japanese Laid-Open Patent Publication No. 2008-180992 relates to a photosensitive resin composition for forming a permanent resist. Japanese Laid-Open Patent Publication No. 2010-006864 describes a photosensitive resin composition solution which includes an imidized tetracarboxylic acid having a specific structure, a diamine and/or isocyanate-based compound, a photosensitive resin, and a photopolymerization initiator and has a viscosity of equal to or less than 100 mPa·s at 25° C.

SUMMARY

On a resin film formed using a photosensitive resin material, patterning is carried out using, for example, lithography. However, there are cases in which, due to a solution used for development, a whitened layer that is not easily dissolved in the solution is generated on the surface of the resin film.

In this case, there is a concern that it may become difficult to realize excellent workability during the patterning. Therefore, in a resin film formed using a photosensitive resin material, there is a demand for realizing excellent workability while maintaining performance as a permanent film.

In one embodiment, there is provided a photosensitive resin material used to form a permanent film, including an alkali-soluble resin (A) having a phenolic hydroxy group and a photosensitizing agent (B), in which the content of iron with respect to all non-volatile components, which is measured through flameless atomic absorption spectroscopy, is equal to or more than 0.005 ppm and equal to or less than 80 ppm.

In another embodiment, there is provided a resin film obtained by curing the photosensitive resin material.

In still another embodiment, there is provided a resin film which constitutes a permanent film and is obtained by curing a photosensitive resin material including an alkali-soluble resin (A) having a phenolic hydroxy group and a photosensitizing agent (B), in which the content of iron, which is measured through flameless atomic absorption spectroscopy, is equal to or more than 0.005 ppm and equal to or less than 80 ppm.

According to the invention, in a resin film formed using a photosensitive resin material, it is possible to realize excellent workability while maintaining performance as a permanent film.

BRIEF DESCRIPTION OF THE DRAWING

The above and other objects, advantages and features of the present invention will be more apparent from the following description of certain preferred embodiments taken in conjunction with the accompanying drawing, in which:

FIG. 1 is a cross-sectional view showing an example of an electronic device according to an embodiment.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments will be described using a drawing. In the drawing, the same components will be given the same reference numeral and description thereof will not be repeated.

A photosensitive resin material according to the embodiment is a photosensitive resin material used to form a permanent film and includes an alkali-soluble resin (A) having a phenolic hydroxy group and a photosensitizing agent (B). In the photosensitive resin material, the content of iron with respect to all non-volatile components, which is measured through flameless atomic absorption spectroscopy, is equal to or more than 0.005 ppm and equal to or less than 80 ppm.

The inventor newly found that, when the content of iron with respect to all the non-volatile components in the photosensitive resin material is set in the above-described range, a resin film formed using the photosensitive resin material is capable of suppressing the generation of a whitened layer during lithography while maintaining the performance as a permanent film. Examples of the performance as a permanent film include durability assessed through HAST test or the like. Therefore, according to the embodiment, a resin film formed using the photosensitive resin material is capable of realizing excellent workability while maintaining the performance as a permanent film.

Hereinafter, the photosensitive resin material according to the embodiment and the constitution of an electronic device including a permanent film formed of the photosensitive resin material will be described in detail.

First, the photosensitive resin material according to the embodiment will be described.

The photosensitive resin material is used to form a permanent film. A resin film constituting the permanent film is obtained by curing the photosensitive resin material. In the embodiment, the permanent film is formed by, for example, patterning a coated film constituted using the photosensitive resin material into a desired shape through exposure and development and then curing the coated film through a thermal treatment or the like.

Examples of the permanent film formed using the photosensitive resin material include interlayer films, surface protective films, and dam materials. The use of the permanent film is not limited thereto, but examples thereof do not include films having strong light-blocking properties with respect to visible light such as color filters and black matrices.

The interlayer film refers to an insulating film provided in a multilayer structure and there is no particular limitation regarding the types thereof. Examples of the interlayer films include films used for semiconductor devices such as insulating interlayers constituting the multilayer interconnection structures of semiconductor elements and built-up layers or core layers constituting circuit substrates. In addition, the examples of the interlayer films include films used in display devices such as flattening films that cover thin film transistors (TFT) in display devices, liquid crystal oriented films, protrusions provided on color filter substrates in multi domain vertical alignment (MVA)-type display devices, and partition walls for forming negative electrodes of organic EL elements.

The surface protective film refers to an insulating film formed on the surfaces of electronic components or electronic devices so as to protect the surfaces and there is no particular limitation regarding the types thereof. Examples of the surface protective films include passivation films and buffer coat layers which are provided on semiconductor elements and cover coats provided on flexible substrates. The dam material is a spacer used to form a hollow portion to dispose an optical element and the like on a substrate.

The photosensitive resin material includes iron. Specifically, the content of iron with respect to all the non-volatile components in the photosensitive resin material, which is measured through flameless atomic absorption spectroscopy, is equal to or more than 0.005 ppm and equal to or less than 80 ppm. When the content of iron is set to be equal to or more than the above-described lower limit value, it is possible to suppress the generation of a whitened layer which is not easily dissolved in a developer during the exposure and development of the resin film formed using the photosensitive resin material. Therefore, it is possible to improve the workability during patterning. In addition, it also becomes possible to improve the temperature cycle resistance of the resin film formed using the photosensitive resin material. On the other hand, when the content of iron is set to be equal to or lower than the above-described upper limit value, it is possible to realize a permanent film having excellent durability by improving humid-resistant reliability and the like of the resin film formed using the photosensitive resin material. In addition, it also becomes possible to suppress the occurrence of poor patterns during patterning. Furthermore, when the content of iron with respect to all the non-volatile components in the photosensitive resin material is set in the above-described range, it is also possible to suppress lithography characteristics becoming uneven due to the uneven elapsed time from a resin film-forming step to an exposure and development step.

In the embodiment, from the viewpoint of improving the workability during patterning while maintaining performance as the permanent film such as durability, the content of iron with respect to all the non-volatile components in the photosensitive resin material is more preferably equal to or more than 0.01 ppm and equal to or less than 50 ppm and even more preferably equal to or more than 0.03 ppm and equal to or less than 45 ppm.

In the embodiment, the content of iron with respect to all the non-volatile components in the photosensitive resin material can be computed from the content of iron in a varnish-form photosensitive resin material measured through flameless atomic absorption spectroscopy. In the flameless atomic absorption spectroscopy, for example, a substance obtained by diluting the varnish-form photosensitive resin material with N-methylpyrrolidone (NMP) or the like may be used.

The proportion (% by mass) of the non-volatile components in the photosensitive resin material can be measured, for example, in the following manner. First, as a specimen, 1.0 g of the photosensitive resin material is put into an aluminum cup of which the mass ($m_0$) has been measured. At this time, the total mass of the specimen and the aluminum cup is represented by $m_1$. Next, the aluminum cup is held in a hot air dryer adjusted to 210° C. for 1 hour at normal pressure, then, is removed from the hot air dryer, and is cooled to room temperature. Next, the total mass ($m_2$) of the cooled specimen and the aluminum cup is measured. In addition, the proportion (% by mass) of the non-volatile components in the photosensitive resin material is computed using the following equation.

$$\text{Non-volatile components (\% by mass)} = (m_2 - m_0)/(m_1 - m_0) \times 100$$

Examples of the iron present in the photosensitive resin material include non-ionic iron. When non-ionic iron is included, it is possible to improve the workability by effectively suppressing the generation of a whitened layer when the resin film formed using the photosensitive resin material is exposed and developed. Examples of the non-ionic iron include iron-containing particles such as particles made of iron or a compound thereof and particles made of an alloy of iron and other metal. Examples of the compound of iron include iron oxide. Examples of other metals include nickel. In the embodiment, when the iron-containing particles such as iron particles, iron oxide particles, or iron alloy particles are mixed with the photosensitive resin material, the above-described constitution can be obtained. Examples of the iron-containing particles include commercially available nano particles produced by Sigma-Aldrich Co. LLC., Attotec Co., Ltd., and Quantum Design Japan.

In a case in which the non-ionic iron is included in the photosensitive resin material, the content of the non-ionic iron with respect to all the non-volatile components in the photosensitive resin material is, for example, preferably equal to or more than 0.005 ppm and equal to or less than 80 ppm, more preferably equal to or more than 0.01 ppm and equal to or less than 50 ppm, and even more preferably equal to or more than 0.03 ppm and equal to or less than 45 ppm. Therefore, in the resin film formed using the photosensitive resin material, it becomes possible to more effectively improve the workability during patterning while maintaining performance as the permanent film such as durability.

As the iron present in the photosensitive resin material, iron ions may be included. In this case, from the viewpoint of suppressing a whitened layer, it is preferable to include both the non-ionic iron and iron ions in the photosensitive resin material.

The photosensitive resin material does not include, for example, particles having a particle diameter of equal to or more than 0.2 μm as the iron. In this case, the iron present in the photosensitive resin material is present in a form of fine particles having a particle diameter of less than 0.2 μm or iron ions dissolved in the photosensitive resin material. At this time, in a case in which the photosensitive resin material is filtered using a filter having a pore diameter of 0.2 μm, there is no residue remaining in the filter. Therefore, it is possible to reliably suppress the occurrence of poor patterns in a lithography step and effectively suppress the occurrence of a whitened layer. The above-described constitution can be realized by filtering the photosensitive resin material obtained by, for example, blending individual components together using a filter having a pore diameter of 0.2 μm.

The photosensitive resin material includes the alkali-soluble resin (A) and the photosensitizing agent (B). Therefore, it is possible to form a photosensitive resin film that can be patterned through lithography using the photosensitive resin material.

((A) Alkali-Soluble Resin)

The alkali-soluble resin (A) is a resin having a phenolic hydroxy group at the main chain or at a side chain. In the embodiment, the alkali-soluble resin (A) includes, for example, one or more selected from phenol resins, acryl-based resins having a phenolic hydroxy group, and the like. Among them, the alkali-soluble resin particularly preferably includes a phenol resin from the viewpoint of improving the balance among workability, humid-resistant reliability, heat resistance, and temperature cycle resistance.

The phenol resin included in the alkali-soluble resin (A) includes, for example, one or more selected from reaction products between a phenol compound and an aldehyde compound represented by a novolac-type phenol resin, reaction products between a phenol compound and a dimethanol compound represented by a phenol aralkyl resin, and a hydroxystyrene resin. Therefore, it becomes possible to more effectively improve the balance among workability, humid-resistant reliability, heat resistance, and temperature cycle resistance in the photosensitive resin material. Among them, the phenol resin more preferably includes one or more selected from novolac-type phenol resins, phenol aralkyl resins, and hydroxystyrene resins.

The phenol compound is not particularly limited and, for example, phenols; cresols such as o-cresol, m-cresol, or p-cresol; xylenols such as 2,3-xylenol, 2,4-xylenol, 2,5-xylenol, 2,6-xylenol, 3,4-xylenol, or 3,5-xylenol; ethyl phenols such as o-ethyl phenol, m-ethyl phenol, or p-ethyl phenol; alkyl phenols such as isopropyl phenol, butyl phenol, or p-tert-butylphenol; or polyvalent phenols such as resorcin, catechol, hydroquinone, pyrogallol, or phloroglucin can be used. The phenol compound can be singly used or a combination of two or more phenol compounds can be used.

The aldehyde compound is not particularly limited as long as the aldehyde compound is an organic compound having an aldehyde group and, for example, formalin, paraformaldehyde, acetaldehyde, benzaldehyde, or salicylaldehyde can be used. As the benzaldehyde, benzaldehyde that is substituted by at least one of an alkyl group, an alkoxy group, and a hydroxy group or unsubstituted benzaldehyde can be used. The aldehyde compound can be singly used or a combination of two or more aldehyde compounds can be used.

In the embodiment, for example, when the phenol compound and the aldehyde compound are reacted in the presence of an acid catalyst, a phenol resin that is the alkali-soluble resin (A) can be obtained. The acid catalyst is not particularly limited and, for example, oxalic acid, nitric acid, sulfuric acid, diethyl sulfate, acetic acid, p-toluenesulfonic acid, phenolsulfonic acid, or benzenesulfonic acid can be used.

The dimethanol compound is not particularly limited and, for example, dimethanol compounds such as 1,4-benzenedimethanol, 1,3-benzenedimethanol, 4,4'-biphenyldimethanol, 3,4'-biphenyldimethanol, 3,3'-biphenyldimethanol, or 2,6-naphthalenedimethanol can be used. In addition, as an alternative of the dimethanol compound, bis(alkoxymethyl) compounds such as 1,4-bis(methoxymethyl)benzene, 1,3-bis(methoxymethyl)benzene, 4,4'-bis(methoxymethyl)biphenyl, 3,4'-bis(methoxymethyl)biphenyl, 3,3'-bis(methoxymethyl)biphenyl, or methyl 2,6-naphthalenedicarboxylate or bis(halogeno alkyl) compounds such as 1,4-bis(chloromethyl)benzene, 1,3-bis(chloromethyl)benzene, 1,4-bis(bromomethyl)benzene, 1,3-bis(bromomethyl)benzene, 4,4'-bis(chloromethyl)biphenyl, 3,4'-bis(chloromethyl)biphenyl, 3,3'-bis(chloromethyl)biphenyl, 4,4'-bis(bromomethyl)biphenyl, 3,4'-bis(bromomethyl)biphenyl, or 3,3'-bis(bromomethyl)biphenyl can be used. The compound can be singly used or a combination of two or more compounds can be used.

The hydroxystyrene resin is not particularly limited and, for example, a polymerization reaction product or a copolymerization reaction product obtained through the radical polymerization, cation polymerization, or anion polymerization of hydroxystyrene, styrene, or a derivative thereof can be used.

In the embodiment, the content of the alkali-soluble resin (A) is preferably equal to or more than 30% by weight and equal to or less than 95% by weight and more preferably equal to or more than 50% by weight and equal to or less than 90% by weight with respect to all the non-volatile components in the photosensitive resin composition.

((B) Photosensitizing Agent)

As the photosensitizing agent (B), a compound generating an acid by irradiation of light can be used and, for example, photosensitive diazoquinone compounds; onium salts such as a diaryliodonium salt, a triarylsulfonium salt, a sulfonium borate salt; a 2-nitrobenzylester compounds; N-iminosulfonate compounds; imidosulfonate compounds; 2,6-bis(trichloromethyl)-1,3,5-triazine compound; or dihydropyridine compounds can be used. Among them, photosensitive diazoquinone compounds having excellent sensitivity or solvent solubility is particularly preferably used.

Examples of the photosensitive diazoquinone compounds include esters of a phenol compound and 1,2-naphthoquinone-2-diazide-5-sulfonic acid or 1,2-naphthoquinone-2-diazide-4-sulfonic acid. In a case in which the photosensitive resin material is a positive-type material, a photosensitizing agent remaining in a relief pattern of a non-exposed portion is considered to be decomposed by heat and generate an acid while being cured and thus the photosensitizing agent also plays an important role as a reaction accelerator. As the photosensitive diazoquinone compound playing the above-described role, an ester of 1,2-naphthoquinone-2-diazide-4-sulfonic acid, which is more easily decomposed by heat, is particularly preferably used.

The content of the photosensitizing agent (B) in the photosensitive resin material is not particularly limited and is preferably equal to or more than 1 part by mass and equal to or less than 200 parts by mass and particularly preferably equal to or more than 5 parts by mass and equal to or less than 50 parts by mass with respect to 100 parts by mass of the alkali-soluble resin (A). Therefore, it becomes possible to realize a photosensitive resin material having favorable patterning performance.

The photosensitive resin composition may optionally include one or more additives such as a crosslinking agent, a coupling agent, a surfactant, a dissolution accelerator, an antioxidant, fillers and a sensitizer. The crosslinking agent is not particularly limited and examples thereof include epoxy compounds, oxetane compounds, methylol group and/or alkoxymethyl group-containing compounds, and the like. The coupling agent is not particularly limited and examples thereof include a variety of silane-based compounds such as epoxy silanes, mercaptosilanes, aminosilanes, alkylsilanes, ureidosilanes, vinylsilanes, and methacryl silanes.

The photosensitive resin composition may include alkali-soluble resins other than the alkali-soluble resin (A) together with the alkali-soluble resin (A) having a phenolic hydroxy group. The alkali-soluble resins other than the alkali-soluble resin (A) are not particularly limited and, for example, the photosensitive resin composition can include one or more selected from precursors having an amide bond such as polybenzoxazole precursors and polyimide precursors and resins obtained through the dehydration and ring-closing of the above-described precursor having an amide bond such as a polybenzoxazole resin or a polyimide resin.

(Solvent)

The photosensitive resin composition can be used in a varnish form after the above-described components are dissolved in a solvent. Examples of the solvent include N-methyl-2-pyrrolidone, γ-butyrolactone, N,N-dimethylacetamide, dimethylsulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl-3-methoxypropionate, and the like. The solvent may be singly used or a mixture of two or more solvents may be used.

A resin film obtained by curing the photosensitive resin material is capable of constituting, for example, the permanent film such as the interlayer film, the surface protective film, and the dam material as described above. Therefore, it is possible to improve durability and the like in electronic devices including the resin film as a permanent film.

The content of the iron with respect to the entire resin film, which is measured through flameless atomic absorption spectroscopy, is equal to or more than 0.005 ppm and equal to or less than 80 ppm. Therefore, it is possible to improve the reliability of electronic devices by improving durability and connection reliability. From the viewpoint of improving the reliability of electronic devices, the content of the iron with respect to the entire resin film is more preferably equal to or more than 0.01 ppm and equal to or less than 50 ppm and even more preferably equal to or more than 0.03 ppm and equal to or less than 45 ppm. The iron present in the resin film includes either or both non-ionic iron and iron ions. From viewpoint of improving the reliability of electronic devices, the resin film preferably includes both non-ionic iron and iron ions.

The above-described resin film can be realized by, for example, setting the content of the iron with respect to all the non-volatile components in the photosensitive resin material, which is measured through flameless atomic absorption spectroscopy, in the numerical range previously described in the embodiment.

Next, an example of an electronic device 100 will be described.

FIG. 1 is a cross-sectional view showing an example of an electronic device 100 according to an embodiment.

The electronic device 100 shown in FIG. 1 is, for example, a semiconductor chip. In this case, for example, the electronic device 100 is mounted on an interconnection substrate through a bump 52, thereby obtaining a semiconductor package. The electronic device 100 includes a semiconductor substrate provided with a semiconductor element such as a transistor and a multilayer interconnection layer provided on the semiconductor substrate (not shown). On the top layer of the multilayer interconnection layer, an insulating interlayer 30 and a top layer interconnection 34 provided on the insulating interlayer 30 are provided. The top layer interconnection 34 is constituted using, for example, Al. In addition, a passivation film 32 is provided on the insulating interlayer 30 and the top layer interconnection 34. An opening through which the top layer interconnection 34 is exposed is provided on a part of the passivation film 32. A re-interconnection layer 40 is provided on the passivation film 32. The re-interconnection layer 40 includes an insulating layer 42 provided on the passivation film 32, a re-interconnection 46 provided on the insulating layer 42, and an insulating layer 44 provided on the insulating layer 42 and the re-interconnection 46. An opening connected to the top layer interconnection 34 is formed in the insulating layer 42. The re-interconnection 46 is formed on the insulating layer 42 and in the opening provided on the insulating layer 42 and is connected to the top layer interconnection 34. An opening connected to the re-interconnection 46 is provided in the insulating layer 44.

In the embodiment, it is possible to constitute one or more of the passivation film 32, the insulating layer 42, and the insulating layer 44 using the resin film formed by curing the above-described photosensitive resin material. In this case, the passivation film 32, the insulating layer 42, and the insulating layer 44 are formed by, for example, exposing a coated film formed of the photosensitive resin material to an ultraviolet ray, carrying out patterning by developing the coated film, and then curing the coated film through heating.

In the opening provided in the insulating layer 44, a bump 52 is formed through, for example, an under bump metallurgy (UBM) layer 50. The electronic device 100 is connected to the interconnection substrate and the like through, for example the bump 52.

The invention is not limited to the above-described embodiment and any alternations, improvements, and the like which do not hinder the achievement of the purpose of the invention are included in the scope of the invention.

Hereinafter, an example of a reference embodiment will be additionally described.

[1] A photosensitive resin material used to form a permanent film, including an alkali-soluble resin (A) having a phenolic hydroxy group and a photosensitizing agent (B), in which the content of iron with respect to all non-volatile components, which is measured through flameless atomic absorption spectroscopy, is equal to or more than 0.005 ppm and equal to or less than 80 ppm.

[2] The photosensitive resin material according to [1], in which the alkali-soluble resin (A) includes a phenol resin.

[3] The photosensitive resin material according to [1] or [2], in which non-ionic iron is included as the iron.

[4] The photosensitive resin material according to any one of [1] to [3], in which particles having a particle diameter of equal to or more than 0.2 μm are not included as the iron.

[5] The photosensitive resin material according to any one of [1] to [4], in which the permanent film is an interlayer film, a surface protective film, or a dam material.

[6] The photosensitive resin material according to any one of [1] to [5], in which the photosensitive resin is not available for use for a color filter or a black matrix.

[7] A resin film obtained by curing the photosensitive resin material according to any one of [1] to [6].

[8] A resin film which constitutes a permanent film, is obtained by curing a photosensitive resin material including an alkali-soluble resin (A) having a phenolic hydroxy group and a photosensitizing agent (B), in which the content of iron, which is measured through flameless atomic absorption spectroscopy, is equal to or more than 0.005 ppm and equal to or less than 80 ppm.

EXAMPLES

Next, examples of the invention will be described.

(Synthesis of Phenol Resin (A-1))

64.9 g (0.60 mol) of m-cresol, 43.3 g (0.40 mol) of p-cresol, 65.1 g (0.65 mol of formaldehyde) of an aqueous solution of 30% by weight of formaldehyde, and 0.63 g (0.005 mol) of oxalic acid dihydrate were prepared in a four-neck round bottom glass flask equipped with a thermometer, a stirrer, a raw material injection opening, and a dried nitrogen gas introduction pipe under a dried nitrogen stream, and were immersed in an oil bath, and a polycondensation reaction was caused at 100° C. for 4 hours under the reflux of a reaction solution. Next, the temperature of the oil bath was increased up to 200° C. for 3 hours, then, the pressure in the flask was decreased to equal to or lower than 50 mmHg, and moisture and volatile components were removed. After that, a resin was cooled to room temperature, thereby obtaining a phenol resin (A-1) that was a novolac-type phenol resin having a weight-average molecular weight of 3200.

(Synthesis of Photosensitizing Agent)

11.04 g (0.026 mol) of phenol represented by Formula (C-1), 18.81 g (0.070 mol) of 1,2-naphthoquinone-2-diazide-4-sulfonyl chloride, and 170 g of acetone were put into a four-neck separable flask equipped with a thermometer, a stirrer, a raw material injection opening, and a dried nitrogen gas introduction pipe, and then the components were stirred and dissolved.

Next, a solution mixture of 7.78 g (0.077 mol) of triethylamine and 5.5 g of acetone was slowly added dropwise while the flask was cooled using a water bath so that the temperature of the reaction solution did not reach equal to or higher than 35° C. The components were reacted at room temperature for 3 hours, then, 1.05 g (0.017 mol) of acetic acid was added, and furthermore, the components were further reacted for 30 minutes. Next, the reaction mixture was filtered, and the filtrate was injected into a solution mixture of water/acetic acid (990 ml/10 ml). Next, the sediment was filtered, was sufficiently washed with water, and then was dried in a vacuum. Therefore, a photosensitizing agent (B) represented by a structure of Formula (Q-1) was obtained.

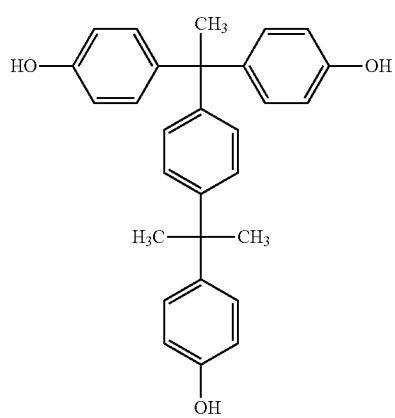

(C-1)

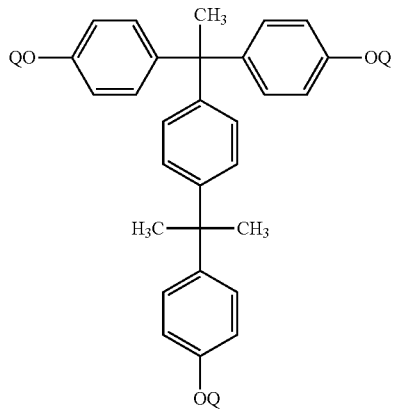

(Q-1)

(in the formula, Q represents a hydrogen atom or

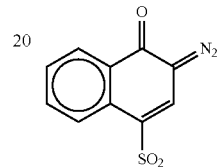 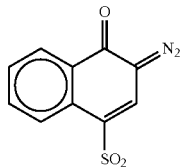

and 90% of the entire Q is ).

Example 1

100 parts by weight of the phenol resin (A-1) as the alkali-soluble resin (A), 15 parts by weight of the photosensitizing agent (B), 20 parts by weight of a bisphenol A-type epoxy resin (EPICOAT YL6810, manufactured by Japan Epoxy Resins Co., Ltd.) as the crosslinking agent, 5 parts by weight of 3-methacryloxypropyl trimethoxysilane as the coupling agent, and 0.00001 parts by weight of iron (III) oxide (manufactured by Sigma-Aldrich Co. LLC., average particle diameter<50 nm) were mixed with and dissolved in γ-butyrolactone as the solvent, and then the mixture was filtered using a PTFE membrane filter having a pore diameter of 0.2 μm, thereby obtaining a varnish-form photosensitive resin material.

The content of iron with respect to all the non-volatile components in the obtained photosensitive resin material was 0.09 ppm. The content of iron with respect to all the non-volatile components in the obtained photosensitive resin material was computed from the content of iron in the varnish-form photosensitive resin material measured through flameless atomic absorption spectroscopy (ZEEnit60, manufactured by Rigaku Corporation). The contents of iron in the photosensitive resin materials were measured in the same manner in individual examples and individual comparative examples described below.

Example 2

100 parts by weight of the phenol resin (A-1) as the alkali-soluble resin (A), 15 parts by weight of the photosensitizing agent (B), 20 parts by weight of a bisphenol A-type epoxy resin (EPICOAT YL6810, manufactured by Japan Epoxy Resins Co., Ltd.) as the crosslinking agent, 5 parts by weight of 3-methacryloxypropyl trimethoxysilane as the coupling agent, and 0.0002 parts by weight of iron (III) oxide (manufactured by Sigma-Aldrich Co. LLC., average particle diameter<50 nm) were mixed with and dissolved in γ-butyrolactone as the solvent, and then the mixture was filtered using a PTFE membrane filter having a pore diameter of 0.2 μm, thereby obtaining a varnish-form photosensitive resin material. The content of iron with respect to all the non-volatile components in the obtained photosensitive resin material was 1.71 ppm.

Example 3

100 parts by weight of the phenol resin (A-1) as the alkali-soluble resin (A), 15 parts by weight of the photosensitizing agent (B), 20 parts by weight of a bisphenol A-type epoxy resin (EPICOAT YL6810, manufactured by Japan Epoxy Resins Co., Ltd.) as the crosslinking agent, 5 parts by weight of 3-methacryloxypropyl trimethoxysilane as the coupling agent, and 0.005 parts by weight of iron (III) oxide (manufactured by Sigma-Aldrich Co. LLC., average particle diameter<50 nm) were mixed with and dissolved in γ-butyrolactone as the solvent, and then the mixture was filtered using a PTFE membrane filter having a pore diameter of 0.2 μm, thereby obtaining a varnish-form photosensitive resin material. The content of iron with respect to all the non-volatile components in the obtained photosensitive resin material was 42.90 ppm.

Example 4

A photosensitive resin material was produced in the same manner as in Example 1 except for that a phenol resin (A-2) which was a phenol aralkyl resin (manufactured by Mitsui Chemicals, Inc., trade name: XLC-3L) having a weight-average molecular weight of 1,200 was used in place of the phenol resin (A-1). The amounts of the respective components blended were as described in Table 1. The content of iron with respect to all the non-volatile components in the obtained photosensitive resin material was 0.07 ppm.

Example 5

A photosensitive resin material was produced in the same manner as in Example 2 except for that a phenol resin (A-2) which was a phenol aralkyl resin (manufactured by Mitsui Chemicals, Inc., trade name: XLC-3L) having a weight-average molecular weight of 1,200 was used in place of the phenol resin (A-1). The amounts of the respective components blended were as described in Table 1. The content of iron with respect to all the non-volatile components in the obtained photosensitive resin material was 1.43 ppm.

Example 6

A photosensitive resin material was produced in the same manner as in Example 3 except for that a phenol resin (A-2) which was a phenol aralkyl resin (manufactured by Mitsui Chemicals, Inc., trade name: XLC-3L) having a weight-average molecular weight of 1,200 was used in place of the phenol resin (A-1). The amounts of the respective components blended were as described in Table 1. The content of iron with respect to all the non-volatile components in the obtained photosensitive resin material was 35.71 ppm.

Example 7

A photosensitive resin material was produced in the same manner as in Example 1 except for that a phenol resin (A-3) which was a polyhydroxystyrene/styrene-copolymerized resin (manufactured by Maruzen Petrochemical Co., Ltd., trade name: MARUKA LYNCUR CST-70) having a weight-average molecular weight of 3,500 was used in place of the phenol resin (A-1). The amounts of the respective components blended were as described in Table 1. The content of iron with respect to all the non-volatile components in the obtained photosensitive resin material was 0.06 ppm.

Example 8

A photosensitive resin material was produced in the same manner as in Example 2 except for that a benzyl alcohol compound (manufactured by Honshu Chemical Industry Co., Ltd., trade name: TML-BPA-MF) represented by Formula (1) described below was used in place of the bisphenol A-type epoxy resin (EPICOAT YL6810, manufactured by Japan Epoxy Resins Co., Ltd.). The amounts of the respective components blended were as described in Table 1. The content of iron with respect to all the non-volatile components in the obtained photosensitive resin material was 1.33 ppm.

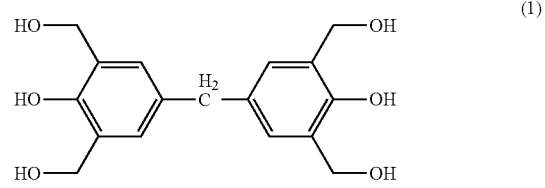

(1)

Comparative Example 1

100 parts by weight of the phenol resin (A-1) as the alkali-soluble resin (A), 15 parts by weight of the photosensitizing agent (B), 20 parts by weight of a bisphenol A-type epoxy resin (EPICOAT YL6810, manufactured by Japan Epoxy Resins Co., Ltd.) as the crosslinking agent, and 5 parts by weight of 3-methacryloxypropyl trimethoxysilane as the coupling agent were mixed with and dissolved in γ-butyrolactone as the solvent, and then the mixture was filtered using a PTFE membrane filter having a pore diameter of 0.2 μm, thereby obtaining a varnish-form photosensitive resin material. The content of iron with respect to all the non-volatile components in the obtained photosensitive resin material was 0.002 ppm.

Comparative Example 2

100 parts by weight of the phenol resin (A–1) as the alkali-soluble resin (A), 15 parts by weight of the photosensitizing agent (B), 20 parts by weight of a bisphenol A-type epoxy resin (EPICOAT YL6810, manufactured by Japan Epoxy Resins Co., Ltd.) as the crosslinking agent, 5 parts by weight of 3-methacryloxypropyl trimethoxysilane as the coupling agent, and 0.20 parts by weight of iron (III) oxide (manufactured by Sigma-Aldrich Co. LLC., average particle diameter<50 nm) were mixed with and dissolved in γ-butyrolactone as the solvent, and then the mixture was filtered using a PTFE membrane filter having a pore diameter of 0.2 μm, thereby obtaining a varnish-form photosensitive resin material. The content of iron with respect to all the non-volatile components in the obtained photosensitive resin material was 1429 ppm.

(Appearance Assessment)

In each of the examples and the comparative examples, the obtained photosensitive resin material was applied onto an 8-inch silicon wafer using a spin coater and then was prebaked on a hot plate at 120° C. for 3 minutes, thereby obtaining a resin film having a film thickness of 7.5 µm. Next, part of the surface of the resin film was dissolved by carrying out a treatment at 23° C. for 20 seconds using an aqueous solution of 2.38% tetramethyl ammonium hydroxide. At this time, the presence of whitened portions on the surface of the resin film was checked.

In each of the examples and the comparative examples, the above-described measurement was carried out five times. For all the resin films, resin films in which no whitened portions were observed were assessed to be B and resin films in which one or more whitened portions were observed were assessed to be D. The results are described in Table 1.

(Workability Assessment)

In each of the examples and the comparative examples, the obtained photosensitive resin material was applied onto an 8-inch silicon wafer using a spin coater and then was prebaked on a hot plate at 120° C. for 3 minutes, thereby obtaining a resin film having a film thickness of 7.5 µm. The resin film was irradiated through a mask manufactured by Toppan Printing Co., Ltd. (test chart No. 1: on which 0.88 µm to 50 µm-wide remaining patterns and removed patterns were drawn) at a variety of exposure amounts using an i-ray stepper (manufactured by Nikon Corporation, NSR-4425i). Next, paddle development was carried out twice using an aqueous solution of 2.38% tetramethyl ammonium hydroxide as the developer for a development time, which was adjusted so that the difference between the film thickness after the prebaking and the film thickness after the development reached 0.5 µm, so as to dissolve and remove exposed portions, and then the resin film was rinsed with pure water for 10 seconds. Opening portions of the pattern formed on the resin film were observed using an optical microscope at a magnification of 200 times and the presence of the generation of residue was checked. Resin films in which no residue was observed were assessed to be A, resin films in which residue was observed but the residue did not impair the availability of the resin film were assessed to be B, and resin films in which residue was observed and the residue impaired the availability of the resin film were assessed to be D. The results are described in Table 1.

(TCT Test)

In each of the examples and the comparative examples, a Temperature Cycle Test (TCT) was carried out in the following manner. First, the obtained photosensitive resin material was applied to a mock element wafer including an aluminum circuit on the surface so as to obtain a final thickness of 5 µm and then was cured by carrying out a patterning process. After that, the wafer was divided into chip sizes, the cut wafer pieces were mounted on a lead frame for a 16 pin dual inline package (DIP) using conductive paste, and then were sealed with a semiconductor-sealing epoxy resin (manufactured by Sumitomo Bakelite Co., Ltd., EME-6300H), thereby producing a semiconductor device.

Next, 500 cycles of a cold heat cycle test was carried out on 5 semiconductor devices (semiconductor packages) obtained above at a temperature in a range of −50° C. to 125° C. using a temperature cycle tester. Next, peeling between a cured film of the photosensitive resin material and a sealed resin obtained by sealing the semiconductor-sealing epoxy resin was observed using an ultrasonic imaging device. The assessment of the temperature cycle test was carried out by assessing cases in which peeling was not observed in all the semiconductor devices as B, cases in which peeling was observed in one semiconductor device out of five semiconductor devices as C, and cases in which peeling was observed in two or more semiconductor devices out of five semiconductor devices as D.

(HAST Test)

In each of the examples and the comparative examples, a Highly Accelerated temperature and humidity Stress Test (HAST) was carried out. The HAST was carried out by treating five semiconductor devices (semiconductor packages) produced in the same manner as in the temperature cycle test assessment for 240 hours under conditions of 130° C. and a humidity of 85% while voltage of 20 V was applied. The assessment of the HAST was carried out by assessing cases in which the occurrence of leakage was not observed in all the semiconductor devices as B, cases in which the occurrence of leakage was observed in one semiconductor device out of five semiconductor devices as C, and cases in which the occurrence of leakage was observed in two or more semiconductor devices out of five semiconductor devices as D.

TABLE 1

| | | | Unit | Example 1 | Example 2 | Example 3 | Example 4 | Example 5 | Example 6 |
|---|---|---|---|---|---|---|---|---|---|
| Photosensitive resin material | Alkali-soluble resin (A) | Phenol resin (A-1) | (g) | 100 | 100 | 100 | — | — | — |
| | | Phenol resin (A-2) | (g) | — | — | — | 100 | 100 | 100 |
| | | Phenol resin (A-3) | (g) | — | — | — | — | — | — |
| | Photosensitizing agent (B) | | (g) | 15 | 15 | 15 | 15 | 15 | 15 |
| | Bisphenol A-type epoxy resin | | (g) | 20 | 20 | 20 | 20 | 20 | 20 |
| | Benzyl alcohol compound | | (g) | — | — | — | — | — | — |
| | 3-Methacryloxypropyl trimethoxysilane | | (g) | 5 | 5 | 5 | 5 | 5 | 5 |
| | Iron oxide | | (g) | 0.00001 | 0.0002 | 0.005 | 0.00001 | 0.0002 | 0.005 |
| Content of iron | | | (ppm) | 0.09 | 1.71 | 42.90 | 0.07 | 1.43 | 35.71 |
| Appearance assessment | | | | B | B | B | B | B | B |
| Workability assessment | | | | A | A | A | A | A | A |
| TCT | | | | B | B | B | B | B | B |
| HAST | | | | B | B | B | B | B | B |

TABLE 1-continued

|  |  |  | Unit | Example 7 | Example 8 | Comparative Example 1 | Comparative Example 2 |
|---|---|---|---|---|---|---|---|
| Photosensitive resin material | Alkali-soluble resin (A) | Phenol resin (A-1) | (g) | — | 100 | 100 | 100 |
|  |  | Phenol resin (A-2) | (g) | — | — | — | — |
|  |  | Phenol resin (A-3) | (g) | 100 | — | — | — |
|  | Photosensitizing agent (B) |  | (g) | 15 | 15 | 15 | 15 |
|  | Bisphenol A-type epoxy resin |  | (g) | 20 | — | 20 | 20 |
|  | Benzyl alcohol compound |  | (g) | — | 15 | — | — |
|  | 3-Methacryloxypropyl trimethoxysilane |  | (g) | 5 | 5 | 5 | 5 |
|  | Iron oxide |  | (g) | 0.00001 | 0.0002 | — | 0.2 |
|  | Content of iron |  | (ppm) | 0.06 | 1.33 | 0.002 | 1429 |
|  | Appearance assessment |  |  | B | B | D | B |
|  | Workability assessment |  |  | A | A | D | A |
|  | TCT |  |  | B | B | C | B |
|  | HAST |  |  | B | B | B | C |

As described in Table 1, in Examples 1 to 8, no whitened layer was not observed in the appearance assessment and favorable results were obtained in the workability assessment. In addition, Examples 1 to 8 all exhibited favorable results in the HAST, which shows that sufficient durability is realized. Furthermore, Examples 1 to 8 also exhibited favorable results in the TCT (temperature cycle test), which shows that the photosensitive resin materials also having excellent temperature cycle resistance are obtained.

It is apparent that the present invention is not limited to the above embodiment, and may be modified and changed without departing from the scope and spirit of the invention.

What is claimed is:

1. A photosensitive resin material used to form a permanent film, comprising:
   one or more selected from a novolac-type phenol resin, a phenol aralkyl resin, and a hydroxystyrene resin as an alkali-soluble resin (A); and
   a photosensitive diazoquinone compound as a photosensitizing agent (B),
   wherein a content of iron with respect to all non-volatile components, which is measured through flameless atomic absorption spectroscopy, is equal to or more than 0.005 ppm and equal to or less than 80 ppm,
   wherein non-ionic iron particles are included as the iron, and
   wherein the permanent film is an interlayer film, a surface protective film, or a dam material.

2. The photosensitive resin material according to claim 1, wherein particles having a particle diameter of equal to or more than 0.2 μm are not included as the iron.

3. The photosensitive resin material according to claim 1, wherein the photosensitive resin material is not available for use for a color filter or a black matrix.

4. A resin film obtained by curing the photosensitive resin material according to claim 1.

5. A resin film which constitutes a permanent film and is obtained by curing a photosensitive resin material including one or more selected from a novolac-type phenol resin, a phenol aralkyl resin, and a hydroxystyrene resin as an alkali-soluble resin (A) and a photosensitive diazoquinone compound as a photosensitizing agent (B),
   wherein a content of iron, which is measured through flameless atomic absorption spectroscopy, is equal to or more than 0.005 ppm and equal to or less than 80 ppm, and non-ionic iron is included as the iron.

6. The photosensitive resin material according to claim 1, wherein the alkali-soluble resin (A) consists of the phenol aralkyl resin.

7. The photosensitive resin material according to claim 1, wherein the alkali-soluble resin (A) consists of the hydroxystyrene resin.

8. The photosensitive resin material according to claim 1, wherein the content of the alkali-soluble resin (A) is equal to or more than 30% by weight and equal to or less than 95% by weight with respect to all of the non-volatile components.

9. The photosensitive resin material according to claim 1, wherein the content of the photosensitizing agent (B) is equal to or more than 1 part by mass and equal to or less than 200 parts by mass with respect to 100 parts by mass of the alkali-soluble resin (A).

10. The photosensitive resin material according to claim 1, wherein the photosensitive resin material further comprises a crosslinking agent.

11. The photosensitive resin material according to claim 1, wherein the photosensitive resin material further comprises a coupling agent.

12. The photosensitive resin material according to claim 1, wherein the photosensitive resin material is in a varnish form by dissolving a photosensitive resin composition in a solvent.

13. The photosensitive resin material according to claim 1,
   wherein the proportion (% by mass) of the non-volatile components in the photosensitive resin material can be measured in the following manner:
   as a specimen, 1.0 g of the photosensitive resin material is put into an aluminum cup of which a mass ($m_0$) has been measured, at this time, a total mass of the specimen and the aluminum cup is represented by $m_1$,
   then the aluminum cup is held in a hot air dryer adjusted to 210° C. for 1 hour at normal pressure, then is removed from the hot air dryer and is cooled to room temperature, and
   then a total mass ($m_2$) of the cooled specimen and the aluminum cup is measured,
   wherein the proportion (% by mass) of the non-volatile components in the photosensitive resin material is computed using the following equation:

non-volatile components (% by mass)=$(m_2-m_0)/(m_1-m_0)\times 100$).

14. The photosensitive resin material according to claim 1, wherein the iron consists of iron particles.

15. The photosensitive resin material according to claim 1, wherein the alkali-soluble resin (A) has a weight-average molecular weight of equal to or more than 1200 and equal to or less than 3500.

16. The photosensitive resin material according to claim 1, wherein the permanent film is the interlayer film.

\* \* \* \* \*